United States Patent
Harris

(10) Patent No.: US 8,054,668 B2
(45) Date of Patent: Nov. 8, 2011

(54) METHOD AND APPARATUS FOR STORING DATA IN A WRITE-ONCE NON-VOLATILE MEMORY

(75) Inventor: Edward B. Harris, Fogelsville, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 12/261,135

(22) Filed: Oct. 30, 2008

(65) Prior Publication Data

US 2009/0059684 A1   Mar. 5, 2009

Related U.S. Application Data

(62) Division of application No. 11/140,497, filed on May 27, 2005, now Pat. No. 7,457,180.

(51) Int. Cl.
*G11C 17/00* (2006.01)

(52) U.S. Cl. .......... 365/104; 365/94; 365/103; 365/207; 365/210.1

(58) Field of Classification Search .......... 365/185.24, 365/189.01, 205, 207, 49, 94, 103, 104, 210.1
See application file for complete search history.

(56) References Cited

U.S. PATENT DOCUMENTS

| | | | | |
|---|---|---|---|---|
| 4,450,537 A | * | 5/1984 | Oldham | 365/217 |
| 5,298,784 A | * | 3/1994 | Gambino et al. | 257/529 |
| 5,608,669 A | * | 3/1997 | Mi et al. | 365/185.03 |
| 5,633,178 A | * | 5/1997 | Kalnitsky | 438/288 |
| 6,496,416 B1 | * | 12/2002 | Look | 365/185.18 |
| 6,936,527 B1 | * | 8/2005 | Look | 438/542 |
| 7,026,692 B1 | * | 4/2006 | Look | 257/390 |
| 2004/0124458 A1 | * | 7/2004 | Kothandaraman | 257/300 |

* cited by examiner

*Primary Examiner* — VanThu Nguyen
(74) *Attorney, Agent, or Firm* — Ryan, Mason & Lewis, LLP

(57) ABSTRACT

In an illustrative embodiment, a memory cell comprises a first and a second MOSFET, wherein the first MOSFET undergoes a process to modify the threshold voltage such that a modified threshold voltage represents a first stored logic value. By determining which one of the first and the second MOSFETs has an altered threshold voltage, the stored logic value is determinable. The threshold voltage of the first MOSFET is altered by supplying current through a MOSFET gate, causing a gate heating effect that results in a threshold voltage shift.

22 Claims, 4 Drawing Sheets

METHOD AND APPARATUS FOR STORING DATA IN A WRITE-ONCE NON-VOLATILE MEMORY

FIELD OF THE INVENTION

The invention relates generally to integrated circuit memory devices and specifically to a method and apparatus for writing data to (programming) write-once non-volatile memory devices.

BACKGROUND OF THE INVENTION

Memory devices for storing digital data are abundant in today's computers, automobiles, cell telephones and media information cards. Certain of these memory devices or storage elements, referred to as nonvolatile memory, retain the stored digital data after device power has been removed. For example non-volatile memory instructions instruct a computer during the boot-up process and store instructions and data for sending and receiving calls in a cellular telephone. Electronic products of all types, from microwave ovens to heavy industrial machinery, store their operating instructions in non-volatile storage elements. Certain non-volatile memory devices offer multiple programming capabilities with previously stored information overwritten by new data. Other non-volatile devices provide only one-time programmability.

Volatile memory devices lose the stored information when power is removed. Dynamic random access memories (DRAM) and static random access memories (SRAM) are two types of volatile memory devices.

A read-only memory (ROM) is a non-volatile memory that provides permanent data storage. Once stored in the ROM device, the data cannot be overwritten or otherwise altered. The ROM is "programmed" during manufacture according to the design of each memory cell such that each cell stores a zero bit or a one bit. Since the ROM is programmed during the design stage, the stored information is modifiable only by redesigning the ROM.

A programmable read-only memory (PROM) is a non-volatile memory device that permits one-time programmability after fabrication. Each PROM memory cell comprises a fusible link further comprising metal or polysilicon material. A plurality of such memory cells and corresponding fuses are formed on a semiconductor die. After fabrication, selected ones of the plurality of fuses are opened with a laser beam, forming a binary pattern of opened and closed fuses that represent stored information. Passing a current through the assembly of fuses reads the stored bits according to the opened and the closed fuses. A sense amplifier receives the output current to detect the logic state of each fuse (a zero bit for an unblown or closed fuse and a one bit for a blown or open fuse or vice versa).

Disadvantageously, fabrication of laser-opened fuses requires the creation of a process mask and execution of additional process steps to form and program the fuses in the die. These fuses consume chip area that could otherwise be devoted to active devices. Also, laser blown fuses require a special laser probe system to identify the location of fuses to be blown.

The fuses can also be electrically opened by passing a sufficiently large current through the fuse to melt the fuse material and create an open circuit. See the commonly owned patent application entitled, Apparatus and Method for Programming a One-time Programmable Memory Device, filed on Sep. 20, 2003, and assigned application Ser. No. 10/675,571. For electrically-opened fuses, a relatively large (i.e., large current carrying capacity) transistor is required to provide sufficient current to open the fuse. These transistors consume a substantial area of the integrated circuit device and thus impose an area penalty, which can be a significant disadvantage for small chips.

An erasable programmable read-only memory (EPROM) is a non-volatile memory device that can be programmed, erased and reprogrammed as desired. The EPROM is programmed electronically and erased by ultraviolet light passing through an ultraviolet-permeable quartz window formed in a package of the memory device.

An EEPROM (electronically erasable programmable read-only memory) and flash EEPROM are read-only memory devices that can be programmed, electronically erased and electronically reprogrammed. A flash memory comprises a metal oxide semiconductor field effect transistor (MOSFET) having a conventional control gate and a floating gate separated from the control gate by a first insulating layer, where the control gate is separated from a channel region by a second insulating layer. Thus the floating gate is electrically isolated from the control gate and the channel region. The flash memory operates by removing (erasing) electrons from the floating gate or raising (programming) electrons to the floating gate. A charge on the floating gate affects the threshold voltage of the MOSFET and thus the control gate voltage required for MOSFET conduction.

When electrons are present on the floating gate, the control gate cannot form a conductive region in the channel in response to a typical gate turn-on voltage. Thus no current flows through the transistor, indicating, for example, a stored logic zero. When the transistor is conducting (with electrons removed from the floating gate and a typical gate turn-on voltage applied to the gate) the stored value represents a logic 1. A voltage applied between the control gate and a MOSFET source/drain terminal forces electrons to or remove electrons from the floating gate. The phenomenon by which electrons are disposed on the floating gate is known as Fowler-Nordheim tunneling.

To form a flash memory array, a plurality of MOSFET control gates are connected to a memory word line. A bit line connects to a first source/drain terminal of each of the same plurality of MOSFETs; a second source/drain terminal is connected to ground. A desired memory address is applied to the word line and the voltage appearing on the bit line represents the read data.

According to another embodiment of a floating gate or flash memory MOSFET element, in lieu of causing electrons to tunnel into the first insulating region separating the control gate from the floating gate, hot carriers can be injected into the first insulating layer for affecting the MOSFET threshold voltage.

Standard integrated circuit fabrication processes do not conventionally include a process step for forming the second or floating gate insulating layer with an optimal thickness. Also, the standard process flow may not be amenable to fabrication of high voltage transistors required for inducing electron tunneling or hot carrier injection. The standard fabrication processes must therefore be modified to fabricate flash memory devices.

As described above, certain non-volatile memory devices are limited to a single programming operation and are thus referred to as "one-time programmable (OTP)," memories. Although the flash memory can be read and written hundreds of times, it can also function as an OTP memory. OTP memory devices are subdivided into those with a relatively large number of storage elements (cells), such as an EEPROM flash memory, and those with a relatively small number of cells. OTP devices with a few cells are useful for trimming analog circuit values within the integrated circuit, for providing security features for the device with which they operate and for identifying the chip in which they are disposed.

In trimming applications, the programmed memory cells are operative to insert or delete resistors and capacitors into a circuit block within the integrated circuit. Stored bits control MOSFET switches for connecting or disconnecting resistors and capacitors in either series or parallel configurations. The analog trimming operation compensates for expected fabrication variations in high precision integrated circuits.

The OTP device can also store a relatively small number of non-modifiable data bits for identifying an integrated circuit chip. For example, during wafer probing a chip's location can be recorded or stored on the chip to uniquely identify the chip and its location on the wafer, i.e., the stored data serves as a die site identifier. After chip packaging, the identification information can be read with an off-chip reader, permitting the manufacturer to track chip failures and wafer yield. It may also be desired to track individual wafer dice by associating each die with a source wafer, a manufacturing lot and a wafer history.

For security applications, the stored OTP data provides a tamper-proof memory device to uniquely identify a hardware device in which the OTP memory is incorporated, such as a cell phone or satellite radio receiver. This identification technique is tamper-resistant since the user cannot reprogram the OTP memory.

BRIEF SUMMARY OF THE INVENTION

According to one embodiment, the present invention comprises a memory array further comprising a plurality of memory cells, each cell comprising: a first MOSFET having a first threshold voltage, a second MOSFET having a second threshold voltage different than the first threshold voltage and an element for determining a logic state stored in the memory cell in response to the threshold voltage of the first and the second MOSFETs.

According to another embodiment, the invention comprises a method for shifting a threshold voltage of a MOSFET, the method comprising: providing a heat source; and heating a gate of the MOSFET.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Before describing in detail the particular method and apparatus for storing data in a write-once non-volatile memory according to the present invention, it should be observed that the present invention resides primarily in a novel and non-obvious combination of elements and process steps. Accordingly, the inventive features have been represented by conventional elements and process steps in the figures, showing only those specific details that are pertinent to the present invention so as not to obscure the disclosure with details that will be readily apparent to those skilled in the art having the benefit of the description herein.

The method and apparatus according to the present invention contemplate a permanent data storage method, and an apparatus formed according to the method, comprising heating a MOSFET gate terminal to permanently change a hydrogen concentration in the gate silicon dioxide dielectric and at the silicon dioxide-silicon interface, which in turn affects the transistor's threshold voltage.

At the interface between the silicon dioxide gate dielectric and the underlying silicon, there are an insufficient number of silicon dioxide bond sites to bond with the silicon atoms. These unsatisfied silicon chemical bonds are referred to as dangling bonds. Hydrogen atoms (from hydrogen gas commonly introduced (alone or as a compound) during one or more integrated circuit fabrication steps) form weak bonds with the silicon at these dangling bond sites. As is known, lattice atoms are in continuous vibration about their equilibrium position. Heating the gate terminal (e.g., using resistive heating) to a relatively low temperature of less than about 500° C. increases the vibratory energy of the lattice atoms, including the hydrogen atoms, and causes the weakly bonded hydrogen to disassociate from their dangling bonds. This process changes the MOSFET threshold voltage.

Figure 1:
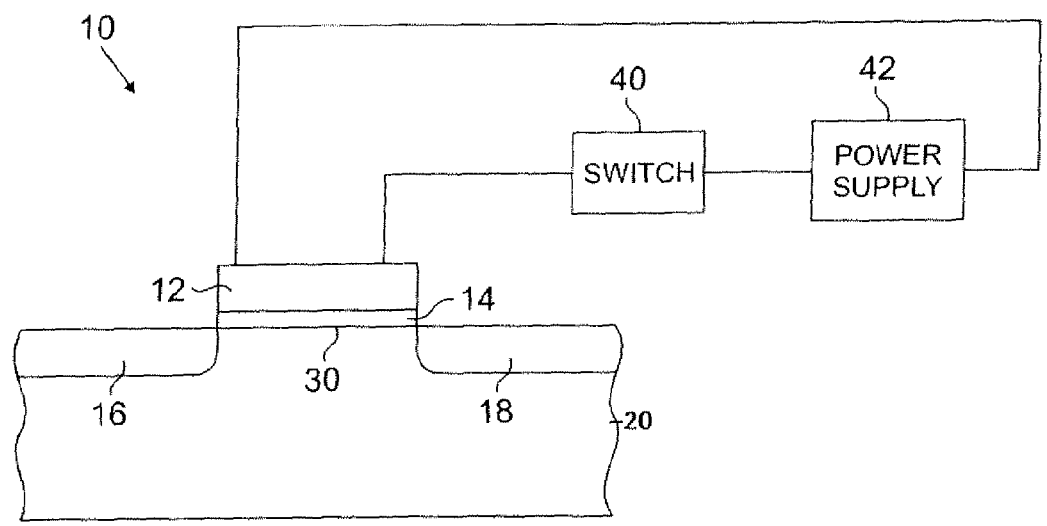
FIG. 1 illustrates a MOSFET and associated elements according to the teachings of the present invention.

FIG. 1 illustrates a MOSFET 10 constructed according to the teachings of the present invention, including a gate 12, a gate oxide dielectric 14 (typically comprising silicon dioxide), and source/drains 16 and 18 formed in a substrate 20 (typically comprising silicon). To affect the hydrogen impurities in the gate dielectric 14 and at the interface 30 between the gate oxide 14 and the substrate 20, a switch 40 is closed to permit current to flow from a power supply 42 through the gate 12. Heating the gate 12 also raises the temperature of the gate oxide 14, affecting the loosely bound hydrogen atoms at the silicon dioxide-silicon interface 30. Releasing the hydrogen atoms from the bond sites causes a threshold voltage change (typically a threshold voltage increase) for the MOSFET 10.

In one embodiment, the switch 40 comprises an NMOSFET or a PMOSFET that is controlled to a closed state to supply current to the gate 12 from a power supply 42 to heat the gate 12.

Figure 2:
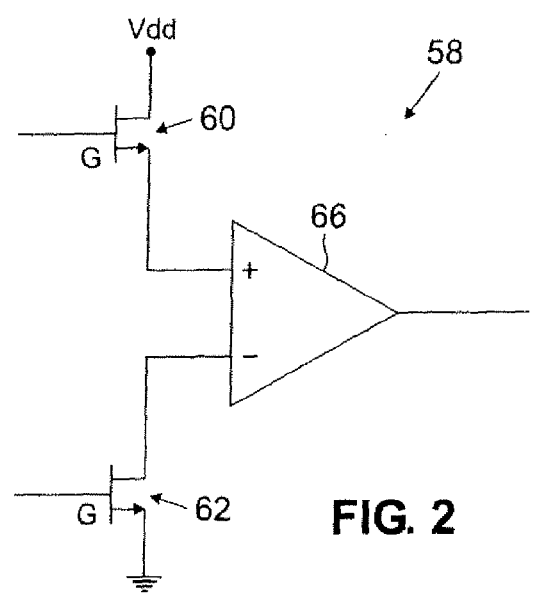
FIG. 2 illustrates a differential amplifier for determining a state of MOSFETs such as the MOSFET of FIG. 1.

FIG. 2 illustrates a memory cell according to the teachings of the present invention, wherein a plurality of such cells are aggregated to form a memory device. One of either MOSFET 60 and 62 comprises a gate (G) that has been heated as described above (to store a data value therein) and therefore exhibits a higher threshold voltage than the other MOSFET. When a read signal is applied to gates G of the MOSFETs 60 and 62, the MOSFET having a lower threshold voltage turns on while the other MOSFET remains in an off state.

If the MOSFET 60 switches to an on state in response to the applied gate voltage the output of a differential amplifier 66 is approximately the supply voltage Vdd. If instead the MOSFET 62 turns on, the output of the differential amplifier 66 is approximately ground. Thus, the output signal from the differential amplifier 66 identifies which of the two MOSFETs 60 or 62 has turned on and thereby indicates whether a binary one or binary zero is stored in the memory cell 58.

Figure 3:
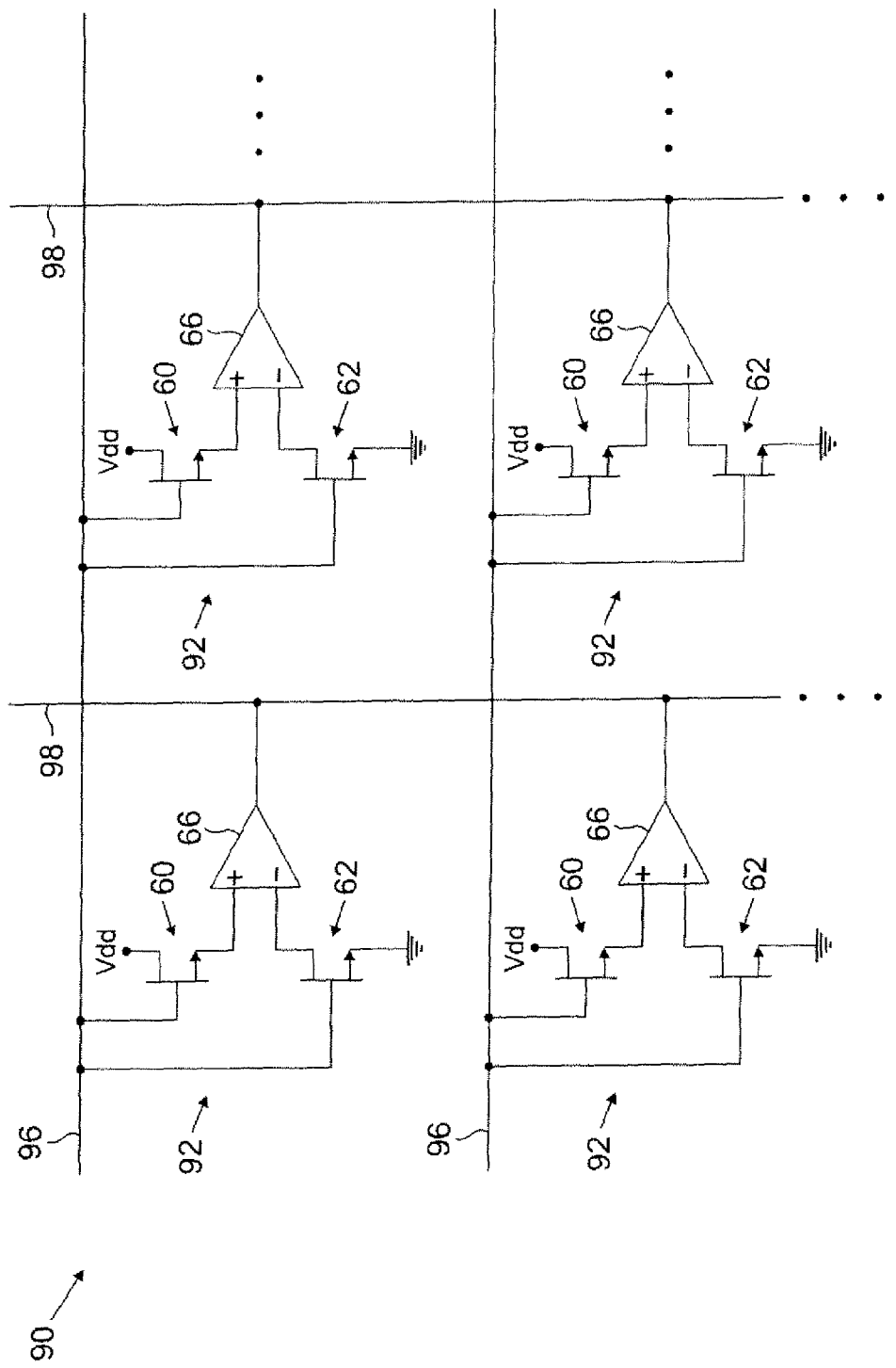
FIGS. 3, 4 and 5 illustrate memory array embodiments comprising a plurality of memory cells constructed according to the teachings of the present invention.

A memory array 90 of FIG. 3 comprises a plurality of memory cells 92, each further comprising the MOSFETs 60 and 62 and die differential amplifier 66 for storing a plurality of data bits in response to heating certain of the MOSFET gates to represent a stored one or zero bit according to the teachings of the present invention. A voltage applied to a word line 96 causes one MOSFET in each of the memory cells 92 to turn on, a condition that is sensed by the differential amplifier 66. An output voltage of the differential amplifier 66 is sensed on a bit line 98. Thus the individual bits of a word are determined by applying a voltage to the word line 96 and sensing the voltages on each bit line 98 of the active word line 96.

The read bits are useful for trimming analog circuit component values by controlling MOSFET switches for connecting or disconnecting resistors and capacitors to trim the components. In another application the stored bits provide security features, e.g., a security code identifying the authorized user. In yet another application the stored bits identify an integrated circuit comprising the memory array 90.

Figure 4:
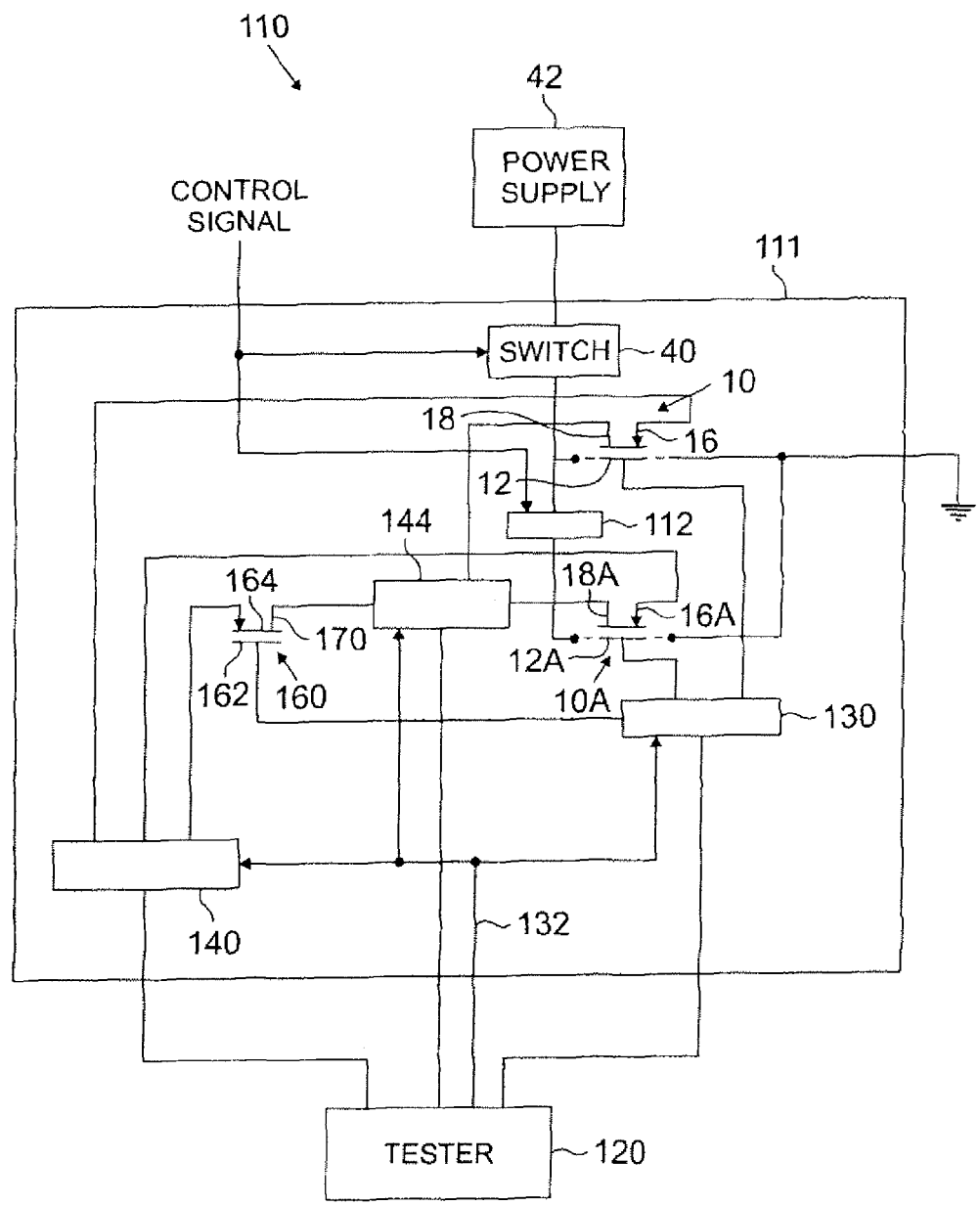

Although not shown in FIG. 3, each memory cell further comprises switches 40 for supplying heating current from the power supply 42 to the gate 12 of certain of the MOSFETs of the plurality of MOSFETs, similar to the gate heating arrangement illustrated in FIG. 4.

FIG. 4 illustrates an integrated circuit 110 comprising a plurality of active devices shown generally by a reference character 111. According to the teachings of the present invention, measurement of a threshold voltage differential between a reference device and one of a plurality of memory cells on the integrated circuit 110 determines a bit value stored in the memory element. A typical one-time programmable memory array according to the teachings of the present invention comprises a plurality of such memory elements, although FIG. 3 illustrates only two memory cells 10 and 10A.

One or more of the gates 12 and 12A of the memory cells 10 and 10A are heated according to the teachings of the present invention in response to current supplied from the power supply 42 for storing a bit value therein. Responsive to a control signal, the switch 40 and a switch 112 are controlled to a desired configuration wherein heating current is supplied to one, both or neither of the memory cells 10 and 10A, wherein the current heats a MOSFET gate to alter the threshold voltage of the MOSFET memory cell to store a logic state to the cell.

To determine the stored logic state, the threshold voltage of the memory cells 10 and 10A is determined. The gates 12 and 12A are switchably connected to a tester 120 via a switch 130 controlled by a control signal supplied to the switch 130 on a control conductor 132. As known by those skilled in the art, the switch 130 (and other switches to be identified below) can be implemented according to any one of several different circuit configurations, including NMOSFETs, PMOSFETs and bipolar junction transistors controlled to operate as switches.

The source/drain terminals 16 and 16A are switchably connected to the tester 120 through a switch 140. The source/drain terminals 18 and 18A are switchably connected to the tester 120 through a switch 144.

A reference PMOSFET 160 comprises a gate terminal 162 switchably connected to the tester 120 through the switch 130, a source/drain terminal 164 switchably connected to the tester 120 through the switch 140 and a source/drain terminal 170 switchably connected to the tester 120 through the switch 144.

There are a number of known techniques for determining the threshold voltage of a MOSFET, from which the threshold voltage shift can be determined according to the present invention by comparison to the threshold voltage of the reference MOSFET. See for example, *Semiconductor Device and Material Characterization*, by Dieter K. Schroder, 1998, pp. 242. To determine the stored logic value of the memory cells 10 and 10A, based on their threshold voltage (the threshold voltage shift), the switches 130, 140 and 144 are configured to alternately connect the gates 12 and 12A, the sources/drains 16 and 16A and the sources/drains 18 and 18A to the tester 120.

The tester 120 determines the threshold voltage of the memory cells 10 and 10A and of the reference PMOSFET 160. According to one technique (referred to as gm (e.g., transconductance) maximum) to determine the threshold voltage of the memory cell 10, the tester 120 suitably biases the source/drain 16/16A and 18/18A to drive the PMOSFET into saturation. The gate voltage (Vg) is ramped and the drain current (Id) determined during the ramping process to create a plot of Id versus Vg. A slope of the Id/Vg curve is the transconductance gm, or gm is the derivative of Id/Vg. The maximum gm value is determined at a point of maximum slope on the Id versus Vg curve. From the point of maximum gm, the Id versus Vg curve is linearly extrapolated to the Vg axis, where the intersection of the extrapolating line with the Vg axis indicates the threshold voltage. The threshold voltage of the memory cell 10A is suitable determined.

According to another technique (referred to as the constant current method) a constant current is applied to the drain terminal while setting the drain and gate voltages to the same value. The voltage represents the threshold voltage for the supplied drain current.

To determine the threshold voltage of the reference PMOSFET 160, the switches 130, 140 and 144 are configured to connect the gate 162, the source/drain 164 and the source/drain 170 to the tester 120. The threshold voltage of the reference device 160 is determined by the tester 120, using any of the known threshold voltage determining techniques including those described above.

A difference between the threshold voltage of the memory cells 10 and 10A and the reference PMOSFET 160 represents the threshold voltage shift and thus the stored logic state of the memory cells 10 and 10A.

Figure 5:
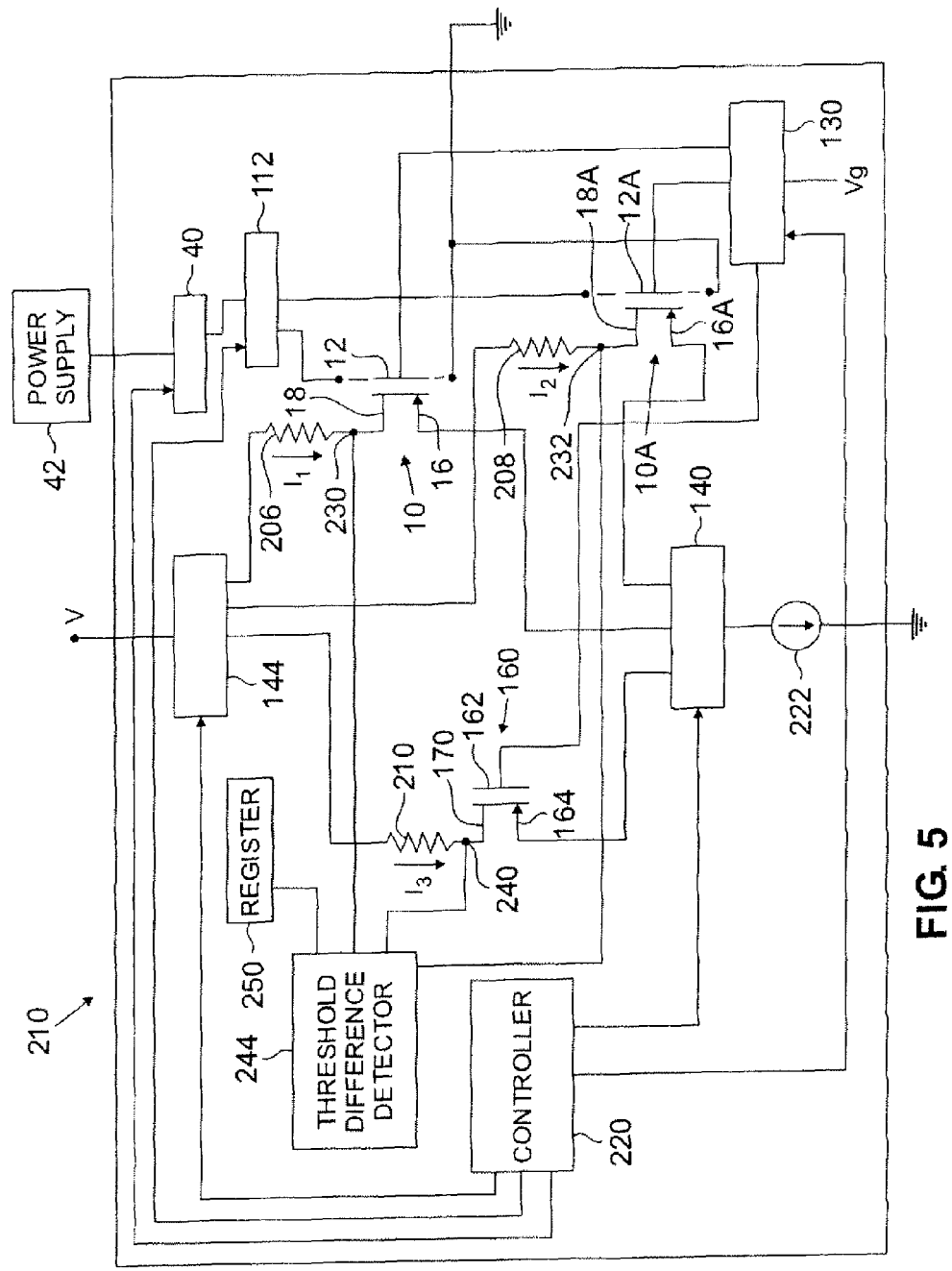

In another embodiment illustrated in FIG. 5, elements for measuring the threshold voltage shift are disposed in an integrated circuit 210, comprising the reference PMOSFET 160 and the memory cells 10 and 10A alternately connected as a differential pair with the reference PMOSFET 160. As described above, one or both of the gates 12 and 12A are heated by current supplied by the power supply 42 through switches 40 and 112 to effect a threshold voltage shift in the heated memory cell.

The switches 130, 140 and 144 are configured, under control of a controller 220, to connect the various terminals of the memory cells 10 and 10A and the reference PMOSFET 160 to determine the threshold voltage of the MOSFETs comprising the memory cells 10 and 10A and of the reference PMOSFET 160. Specifically, the switch 130 connects the gates 12, 12A and 162 to a gate drive voltage Vg and the switch 140 connects the drain/sources 16, 16A and 164 to a current source 222.

To measure the threshold voltage of one of the memory cells 10 and 10A, from which the threshold voltage difference can be determined, the switch 144 is configured to provide current $I_1$ through a resistor 206 or a current $I_2$ through a resistor 208. A current I₃ flows through a resistor 210. A voltage Vg is supplied to the gate terminal 12 or 12A and the gate 162.

With the gate voltages applied as described, the current I.sub.1 (or I.sub.2) through the resistor 206 (or the resistor 208) and the current I.sub.3 through the resistor 210 differ in response to the threshold voltage difference between their respective PMOSFETs. Thus the voltages at terminals 230 (or 232) and 240 differ according to the threshold voltage difference. A threshold difference detector 244 determines the threshold voltage difference between the reference PMOSFET device 160 and the PMOSFET memory cells 10 and 10A. The threshold difference detector 244 stores a value representing the measured threshold voltage difference (and thus the stored logic value in the memory cell 10 (or the memory cell 10A)) in an on-chip memory element, such as a register 250. In another embodiment, the memory element for storing the value is located off-chip.

According to another embodiment, in lieu of using the reference PMOSFET device 160 to determine a threshold reference voltage from which the threshold difference is determined, the determined threshold voltage of the memory cells 10 and 10A is compared with a nominal threshold voltage (using a simple comparator having one terminal responsive to a reference threshold value, for example).

As can be appreciated by those skilled in the art, a memory cell of the present invention can be implemented without special technology or processing steps, and a memory array can be fabricated from a plurality of such memory cells with provisions for heating the gate to affect the threshold voltage. By comparison, fabrication of a prior art floating gate memory device requires special processing steps to form the a floating gate and program or erase electrons from the floating gate as described above. Also, the present invention does not require the relatively large MOSFETs to carry the fuse-blowing current for memory devices that are programmed by opening fuses. The fabrication costs and integrated circuit area penalties are relatively low for the present invention, when compared with prior art techniques for implementing one time programmable memory cells.

Although certain embodiments of the present invention are described with reference to the use of NMOSFETs or PMOSFETs, those skilled in the art recognize that the various other embodiments can be practiced with PMOSFETs or NMOSFETs with appropriate modification to the voltages applied to the MOSFET terminals.

While the invention has been described with reference to preferred embodiments, it will be understood by those skilled in the art that various changes may be made and equivalent elements may be substituted for the elements thereof without departing from the scope of the present invention. All examples and embodiment set forth herein are permissive rather than mandatory and illustrative rather than exhaustive. The scope of the present invention further includes any combination of the elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. A memory device for storing a logic state in a memory cell comprising:
a reference device; and
a tester configured to determine a reference device operating parameter of the reference device and a memory cell operating parameter of the memory cell, and to determine an operating parameter difference between the reference device operating parameter and the memory cell operating parameter in response thereto;
wherein the stored logic state of the memory cell is related to the operating parameter difference; and
wherein the stored logic state of the memory cell is established by heating a gate of the memory cell to a temperature of less than about 500° C.

2. The memory device of claim 1 wherein the reference device comprises a reference MOSFET not having a floating gate and the memory cell comprises a MOSFET not having a floating gate.

3. The memory device of claim 2 wherein the reference device operating parameter comprises a first threshold voltage of the reference MOSFET and the memory cell operating parameter comprises a second threshold voltage of the memory cell MOSFET.

4. The memory device of claim 1 further comprising a register storing a value representing the logic state of the cell in response to the operating parameter difference.

5. The memory device of claim 1 further comprising a current source supplying current to the gate of the memory cell to cause a change in the memory cell operating parameter wherein the memory cell operating parameter is a memory cell threshold voltage.

6. The memory device of claim 5 wherein the current heats the gate, and wherein heat transfer from the gate to a gate oxide/silicon substrate interface causes a shift in the memory cell threshold voltage indicative of storing the logic state in the memory cell.

7. An apparatus for determining a threshold voltage difference indicative of a stored logic state of a MOSFET memory cell, the apparatus comprising:
a MOSFET reference device not having a floating gate; and
a threshold detector operative to determine the difference between a reference threshold voltage of the MOSFET reference device and a memory cell threshold voltage of the MOSFET memory cell, the MOSFET memory cell not having a floating gate, wherein the difference indicates the stored logic state;
wherein the stored logic state of the MOSFET memory cell is established by heating a gate of the MOSFET memory cell to a temperature of less than about 500° C.

8. A method for shifting a threshold voltage of a MOSFET, the method comprising:
providing a heat source; and
heating a gate of the MOSFET having a first threshold voltage prior to heating the gate and having a second threshold voltage after heating the gate;
wherein a stored logic state of the MOSFET is established by said heating of the gate;
wherein said heating passing a current through the gate from a first electrical connection to a second electrical connection so as to heat the gate to a temperature of less than about 500° C.; and
wherein said temperature of less than about 500° C. is sufficient to establish the stored logic state of the MOSFET.

9. A method for shifting a threshold voltage of a MOSFET, the method comprising:
providing a current source; and
supplying current through a gate of the MOSFET to heat the gate to a temperature of less than about 500° C., wherein the MOSFET has a first threshold voltage prior to supplying the current through the gate and has a second threshold voltage after supplying the current through the gate;

wherein a stored logic state of the MOSFET is established by said heating of the gate to the temperature of less than about 500° C.

10. A method for shifting a threshold voltage of a MOSFET and for determining a conductive state of the MOSFET, the method comprising:

supplying a current through a gate of a first MOSFET;
providing a second MOSFET having a gate;
applying a turn-on voltage to the gate of the first MOSFET and to the gate of the second MOSFET; and
determining whether the first MOSFET or the second MOSFET is in a conductive state in response to the turn-on voltage;
wherein the step of supplying a current further comprises heating the gate of the first MOSFET to a temperature of less than about 500° C. by passing the current therethrough; and
wherein a stored logic state of the first MOSFET is established by said heating the gate of the first MOSFET to the temperature of less than about 500° C.

11. The method of claim 10 wherein the step of determining whether the first MOSFET or the second MOSFET is in a conductive state comprises comparing a voltage across a channel of the first MOSFET with a voltage across a channel of the second MOSFET.

12. A method for programming a memory array to store logic states in a plurality of memory cells of the memory array, each memory cell comprising a MOSFET having a single gate and not having a floating gate, the method comprising:

providing a current; and
supplying the current to a gate of selected ones of the plurality of memory cells to affect a threshold voltage change in the selected ones of the plurality of memory cells, wherein a threshold voltage of each one of the plurality of memory cells indicates a logic state stored therein, wherein the stored logic state of the memory cell is established by heating the gate of the selected ones of the plurality of memory cells to a temperature of less than about 500° C.;
wherein the memory array further comprises a reference element providing a reference threshold voltage for comparison with the threshold voltage of each one of the plurality of memory cells.

13. The method of claim 12 further comprising determining the threshold voltage of the plurality of memory cells and comparing each determined threshold voltage with a reference threshold voltage, wherein a difference therebetween indicates a logic state of each one of the plurality of memory cells.

14. The method of claim 12 wherein the reference element comprises a reference MOSFET having a single gate and not having a floating gate.

15. The method of claim 12 wherein the current heats the gate of selected ones of the plurality of memory cells to disassociate weak bonds formed within the gate of the memory cells due to impurities in a gate oxide layer of the memory cells.

16. The memory device of claim 2 wherein a gate oxide layer of the memory cell MOSFET has impurities which form weak bonds with a silicon substrate of the memory cell MOSFET, the memory cell MOSFET is selectively heated to disassociate the weak bonds in the gate oxide layer and change the memory cell operating parameter of the memory cell MOSFET.

17. The memory device of claim 5 wherein the current heats the gate and causes heat transfer from the gate to a gate oxide layer underneath the gate and overlying a silicon substrate, the gate oxide layer having impurities which form weak bonds with the silicon substrate, the heat transfer causes a change in the number of weak bonds formed with the silicon substrate in the gate oxide layer changing the memory cell threshold voltage indicative of the logic state of the memory cell.

18. The memory device of claim 1 wherein the memory cell is non-volatile and wherein the stored logic state of the non-volatile memory cell is established by heating the gate of the non-volatile memory cell.

19. The memory device of claim 5 wherein the current is passed through the gate from a first electrical connection to a second electrical connection, said first and second electrical connections both being disposed on a given surface of the gate.

20. The memory device of claim 5 wherein the gate is disposed above a gate dielectric, and wherein the current is passed through the gate from a first electrical connection to a second electrical connection, said first and second electrical connections both being disposed above the gate dielectric.

21. The method of claim 8 wherein the current heats the gate and causes heat transfer from the gate directly onto a gate oxide layer immediately underneath the gate and overlying a silicon substrate.

22. The method of claim 9 wherein the current heats the gate and causes heat transfer from the gate directly onto a gate oxide layer immediately underneath the gate and overlying a silicon substrate.

* * * * *